(12) United States Patent
Streefkerk et al.

(10) Patent No.: US 7,528,929 B2
(45) Date of Patent: May 5, 2009

(54) LITHOGRAPHIC APPARATUS AND DEVICE MANUFACTURING METHOD

(75) Inventors: Bob Streefkerk, Tilburg (NL); Johannes Jacobus Matheus Baselmans, Oirschot (NL); Richard Joseph Bruls, Eindhoven (NL); Marcel Mathijs Theodore Marie Dierichs, Venlo (NL); Sjoerd Nicolaas Lambertus Donders, 's-Hertogenbosch (NL); Christiaan Alexander Hoogendam, Veldhoven (NL); Hans Jansen, Eindhoven (NL); Erik Roelof Loopstra, Heeze (NL); Jeroen Johannes Sophia Maria Mertens, Duizel (NL); Johannes Catharinus Hubertus Mulkens, Waalre (NL); Ronald Walther Jeanne Severijns, Veldhoven (NL); Sergei Shulepov, Eindhoven (NL); Herman Boom, Eindhoven (NL); Timotheus Franciscus Sengers, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 442 days.

(21) Appl. No.: 10/986,178

(22) Filed: Nov. 12, 2004

(65) Prior Publication Data

US 2005/0175776 A1  Aug. 11, 2005

(30) Foreign Application Priority Data

Nov. 14, 2003 (EP) .................................. 03257195
Aug. 3, 2004  (EP) .................................. 04254659

(51) Int. Cl.
*G03B 27/53* (2006.01)
*G03B 27/54* (2006.01)

(52) U.S. Cl. .................. 355/30; 355/67; 355/71; 355/72; 378/34; 378/35; 250/492.2

(58) Field of Classification Search .............. 355/30, 355/53, 67, 72, 75, 71; 378/34, 35; 250/492.2
See application file for complete search history.

(56) References Cited

U.S. PATENT DOCUMENTS

| 3,573,975 | A | 4/1971 | Dhaka et al. | 117/212 |
| 3,648,587 | A | 3/1972 | Stevens | 95/44 |
| 4,346,164 | A | 8/1982 | Tabarelli et al. | 430/311 |

(Continued)

FOREIGN PATENT DOCUMENTS

DE            206 607          2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—D. Rutledge
(74) *Attorney, Agent, or Firm*—Pillsbury Winthrop Shaw Pittman LLP (57) ABSTRACT

An immersion lithographic projection apparatus is disclosed in which liquid is provided between a projection system of the apparatus and a substrate. The use of both liquidphobic and liquidphilic layers on various elements of the apparatus is provided to help prevent formation of bubbles in the liquid and to help reduce residue on the elements after being in contact with the liquid.

35 Claims, 5 Drawing Sheets

U.S. PATENT DOCUMENTS

| | | | |
|---|---|---|---|
| 4,390,273 A | 6/1983 | Loebach et al. ............. 355/125 |
| 4,396,705 A | 8/1983 | Akeyama et al. ............ 430/326 |
| 4,480,910 A | 11/1984 | Takanashi et al. ............. 355/30 |
| 4,509,852 A | 4/1985 | Tabarelli et al. ............... 355/30 |
| 5,040,020 A | 8/1991 | Rauschenbach et al. ....... 355/53 |
| 5,121,256 A | 6/1992 | Corle et al. .................. 359/664 |
| 5,610,683 A | 3/1997 | Takahashi .................... 355/53 |
| 5,715,039 A | 2/1998 | Fukuda et al. |
| 5,825,043 A | 10/1998 | Suwa .......................... 250/548 |
| 5,900,354 A | 5/1999 | Batchelder .................. 430/395 |
| 6,191,429 B1 | 2/2001 | Suwa .......................... 250/548 |
| 6,236,634 B1 | 5/2001 | Lee et al. ..................... 369/112 |
| 6,600,547 B2 | 7/2003 | Watson et al. ................. 355/30 |
| 6,603,130 B1 | 8/2003 | Bisschops et al. ......... 250/492.1 |
| 6,788,477 B2 | 9/2004 | Lin |
| 6,809,794 B1* | 10/2004 | Sewell .......................... 355/30 |
| 6,867,844 B2 | 3/2005 | Vogel et al. |
| 7,119,874 B2 | 10/2006 | Cox et al. |
| 2002/0020821 A1 | 2/2002 | Van Santen et al. .......... 250/492 |
| 2002/0163629 A1 | 11/2002 | Switkes et al. ................. 355/53 |
| 2003/0030916 A1 | 2/2003 | Suenaga |
| 2003/0123040 A1 | 7/2003 | Almogy ........................ 355/69 |
| 2003/0174408 A1 | 9/2003 | Rostalski et al. |
| 2004/0000627 A1 | 1/2004 | Schuster ................... 250/201.2 |
| 2004/0075895 A1 | 4/2004 | Lin ............................. 359/380 |
| 2004/0109237 A1 | 6/2004 | Epple et al. |
| 2004/0114117 A1 | 6/2004 | Bleeker ......................... 355/53 |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. ...................... 378/34 |
| 2004/0160582 A1 | 8/2004 | Lof et al. ...................... 355/30 |
| 2004/0165159 A1 | 8/2004 | Lof et al. ...................... 355/30 |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. ...................... 355/30 |
| 2004/0211920 A1 | 10/2004 | Derksen et al. .......... 250/492.1 |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0239954 A1 | 12/2004 | Bischoff ..................... 356/635 |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano ........................ 355/30 |
| 2005/0007569 A1 | 1/2005 | Streefkerk et al. .............. 355/30 |
| 2005/0018155 A1 | 1/2005 | Cox et al. ...................... 355/30 |
| 2005/0024609 A1 | 2/2005 | De Smit et al. ................ 355/18 |
| 2005/0030497 A1 | 2/2005 | Nakamura .................... 355/30 |
| 2005/0030506 A1 | 2/2005 | Schuster |
| 2005/0036121 A1 | 2/2005 | Hoogendam |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046813 A1 | 3/2005 | Streefkerk et al. ............. 355/30 |
| 2005/0046934 A1 | 3/2005 | Ho et al. ..................... 359/380 |
| 2005/0048223 A1 | 3/2005 | Pawloski et al. |
| 2005/0052632 A1 | 3/2005 | Miyajima .................... 355/53 |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. ............... 355/53 |
| 2005/0094125 A1 | 5/2005 | Arai ............................ 355/72 |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0122505 A1 | 6/2005 | Miyajima .................... 355/72 |
| 2005/0132914 A1 | 6/2005 | Mulkens et al. .......... 101/463.1 |
| 2005/0134815 A1 | 6/2005 | Van Santen et al. |
| 2005/0134817 A1 | 6/2005 | Nakamura .................... 355/53 |
| 2005/0140948 A1 | 6/2005 | Tokita .......................... 355/30 |
| 2005/0141098 A1 | 6/2005 | Schuster |
| 2005/0145803 A1 | 7/2005 | Hakey et al. |
| 2005/0146693 A1 | 7/2005 | Ohsaki ......................... 355/30 |
| 2005/0146694 A1 | 7/2005 | Tokita .......................... 355/30 |
| 2005/0146695 A1 | 7/2005 | Kawakami |
| 2005/0147920 A1 | 7/2005 | Lin et al. |
| 2005/0151942 A1 | 7/2005 | Kawashima ................. 355/30 |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0200815 A1 | 9/2005 | Akamatsu .................... 353/53 |
| 2005/0205108 A1* | 9/2005 | Chang et al. .................... 134/1 |
| 2005/0213065 A1 | 9/2005 | Kitaoka ....................... 355/53 |
| 2005/0213066 A1 | 9/2005 | Sumiyoshi ................... 355/53 |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219489 A1 | 10/2005 | Nei et al. ..................... 355/53 |
| 2005/0225737 A1 | 10/2005 | Weissenrieder et al. |
| 2005/0233081 A1 | 10/2005 | Tokita ........................ 427/256 |
| 2005/0270505 A1 | 12/2005 | Smith |
| 2006/0238730 A1 | 10/2006 | Nei et al. |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0 060 729 A2 | 9/1982 |
| EP | 0418427 | 3/1991 |
| EP | 1039511 | 9/2000 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | A 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2001-125259 A | 5/2001 |
| JP | 2004-193252 | 7/2004 |
| JP | 2004-356205 A | 12/2004 |
| JP | 2005-109426 A | 4/2005 |
| WO | WO 96/04123 | 2/1996 |
| WO | WO 99/49504 | 9/1999 |
| WO | WO 01/27978 A1 | 4/2001 |

| | | |
|---|---|---|
| WO | WO 02/13194 A1 | 2/2002 |
| WO | WO 02/091078 A1 | 11/2002 |
| WO | WO 03/077037 A1 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/112108 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A2 | 8/2005 |
| WO | WO 2005/081030 A1 | 9/2005 |
| WO | WO 2005/081067 A1 | 9/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "⅛ μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_s$ coefficient in nonparaxial λ/NA scaling equations for resolution, depth of focus, and immersion lithography, *J. Microlith., Microfab., Microsyst.* 1(1):7-12 (2002).
Information Disclosure Statement of U.S. Appl. No. 11/502,393, dated Aug. 11, 2006.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Japanese Office Action for Japanese Patent Application No. 2004-328567, dated Feb. 28, 2008.

* cited by examiner

LITHOGRAPHIC APPARATUS AND DEVICE MANUFACTURING METHOD

This application claims priority from European patent application EP 03257195.2, filed Nov. 14, 2003 and European patent application EP 04254659.8, filed Aug. 3, 2004, both of which are incorporated herein in their entirety.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see, for example, U.S. Pat. Ser. No. U.S. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
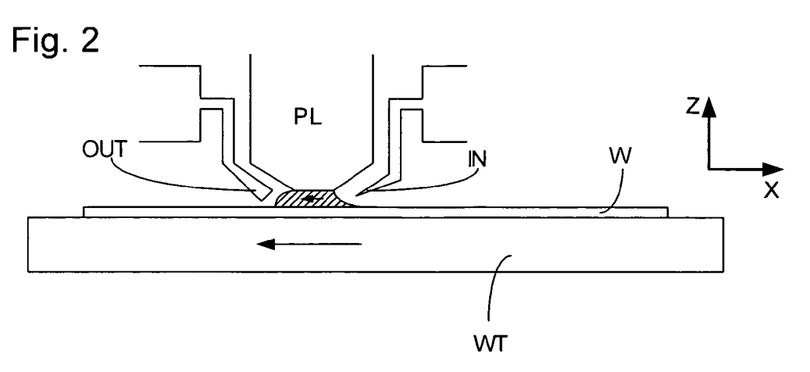
FIG. 2 illustrates, in cross section, a liquid supply system which may be used with one or more embodiments of the present invention.
Figure 3:
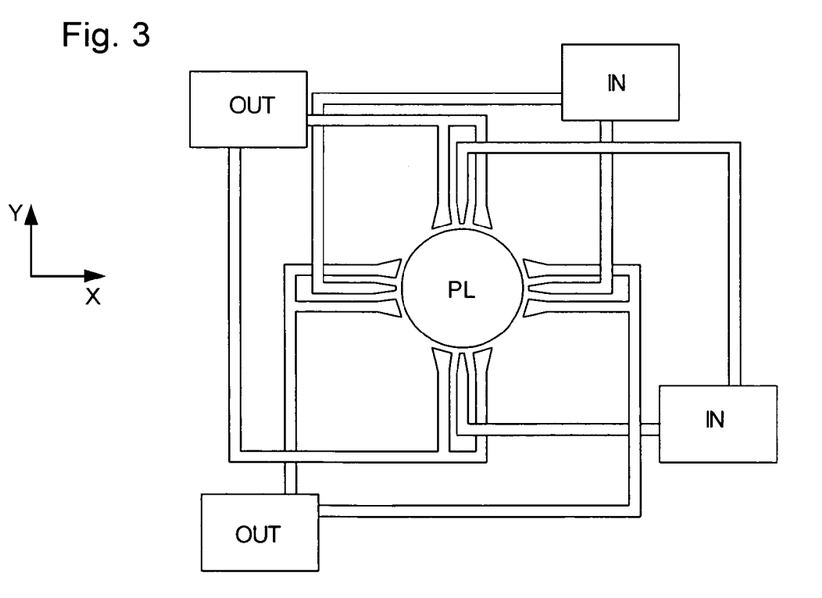
FIG. 3 illustrates, in plan, the liquid supply system of FIG. 2.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A problem with having various components of the lithographic projection apparatus (e.g., the projection system, the substrate, the substrate table, etc.) in contact with immersion liquid is that once the liquid supply system has moved to another component or the liquid is removed, liquid residue may remain behind which may lead to liquid contamination of other components within the lithographic apparatus. Furthermore, the movement of liquid relative to surfaces of various components in the lithographic apparatus may generate bubbles within the immersion liquid which may be deleterious to the optical performance of the apparatus. Further, in some immersion lithography apparatus, leakage of liquid between the liquid supply system and the substrate, especially during scanning movement, may occur.

SUMMARY

Accordingly, it would be advantageous, for example, to address contamination by, bubbles in and/or leakage of immersion liquid in an immersion lithographic apparatus According to an aspect of the invention, there is provided a lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, wherein the liquid has a contact angle of (a) less than 60° with the projection system, or the liquid supply system, or both, or (b) less than 80° with a surface of the substrate, or (c) both (a) and (b).

If an immersion liquid has a contact angle of less than 60° with a surface, during relative movement of the immersion liquid and the surface, the formation of bubbles in the immersion liquid may be less likely. Thus, if the immersion liquid is based on water, the surface should be hydrophilic. A way that the immersion liquid has a contact angle of less than 60° with the substrate is to include in the immersion liquid an additive configured to reduce the surface tension of the immersion liquid. For the types of material which the substrate, final element and liquid supply system are made of, an additive such as a surfactant or soap is well suited. In an embodiment, it is advantageous to have the surface tension between the immersion liquid and the substrate, final element and/or liquid supply system greater than between the immersion liquid and air. This is likely to prevent bubble formation due to relative movement of the immersion liquid to the surface.

An advantageous arrangement for reducing leakage is to have the immersion liquid have a contact angle of less than 60° with a surface of the final element and the liquid supply system and a contact angle greater than 90° with a surface of the substrate and/or substrate table and/or a substrate table mounted sensor. In this arrangement, the immersion liquid "sticks" to the final element and liquid supply system and slides easily over the element below the liquid supply system which is moving relative to the liquid supply system. Thus, leakage from the liquid supply system between the liquid supply system and the element beneath the liquid supply system may be reduced.

Examples of surfaces with which the immersion liquid has a contact angle of less than 60° include glass, a glass ceramic, a metal oxide or a metal. The surfaces may be provided by a surface treatment which is optionally a coating or a polymer.

According to an aspect of the invention, there is provided a lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and (a) the substrate, or (b) a sensor, or (c) a shutter member, or (d) any combination of (a)-(c), with a liquid, wherein the liquid has a contact angle of greater than 90° with a surface of (e) the substrate, or (f) the sensor, or (g) the shutter member, or (h) the projection system, or (i) any combination of (e)-(h), which surface is (j) alignable with an optical axis of the apparatus, or (k) a surface of the projection system, or (l) substantially all of a top surface of the substrate table, or (m) any combination of (j)-(l).

Having a contact angle greater than 90° helps to reject the immersion liquid from the surface so that it is an easy task to leave the surface dry without any immersion liquid residue remaining on the surface. If the surface is a surface of a shutter member, this is also advantageous because it means that the shutter member can be easily removed (i.e. with less force) from the liquid supply system as surface tension between the liquid supply system and the shutter member is unlikely to develop to hold the shutter member to the liquid supply system.

If the immersion liquid has a contact angle of greater than 90° with surfaces of both the substrate and the projection system, this may form a system which can advantageously be used by the liquid supply system to confine the liquid to only a localized area of the substrate. With this system, the immersion liquid may be held in place in the localized area by a plurality of gas inlets to confine the immersion liquid to the localized area of the substrate. This may be achieved by simply having a gas pressure around a periphery of the localized area to hold the immersion liquid in place. It would be advantageous, for example, that the plurality of gas inlets are positioned around the optical axis of the apparatus and are for directing gas in a direction with at least a component towards the optical axis. It may be advantageous that the gas inlets do not face directly towards the optical axis of the apparatus but rather create a flow of gas in a circular pattern around the optical axis. In an embodiment, gas is blown in a plane substantially parallel to a top surface of the substrate.

A way of ensuring that immersion liquid has a contact angle of greater than 90° with the surface is to provide a surface that comprises elevations and depressions, wherein the distance between elevations ranges from 5 to 200 µm and the height of the elevations from 5 to 100 µm and wherein at least the elevations are made of a liquidphobic polymer or a material made durably liquidphobic.

According to a further aspect of the invention, there is provided a device manufacturing method, comprising:

providing a liquid to a space between a projection system of a lithographic projection apparatus and a substrate, the liquid having a contact angle of (a) less than 60° with the projection system, or a liquid supply system used to provide the liquid, or both, or (b) less than 80° with a surface of the substrate, or (c) both (a) and (b); and projecting a patterned beam of radiation through the liquid using the projection system onto a target portion of the substrate.

According to a further aspect of the invention, there is provided a device manufacturing method, comprising:

providing a liquid to a space between a projection system of a lithographic projection apparatus and (a) a substrate, or (b) a sensor, or (c) a shutter member, or (d) any combination of (a)-(c), with a liquid, the liquid having a contact angle of greater than 90° with a surface of (e) the substrate, or (f) the sensor, or (g) the shutter member, or (h) the projection system, or (i) any combination of (e)-(h), which surface is (j) alignable with an optical axis of the lithographic projection apparatus, or (k) a surface of the projection system, or (l) substantially all of a top surface of a substrate table holding the substrate, or (m) any combination of (j)-(l); and projecting a patterned beam of radiation using the projection system through the liquid onto a target portion of the substrate.

According to a further aspect of the invention, there is provided a device manufacturing method, comprising projecting a patterned beam of radiation through a liquid onto a target portion of a substrate, a surface of the substrate comprising a topcoat insoluble in the liquid and having a contact angle with the liquid of less than 80°.

According to a further aspect of the invention, there is provided a substrate for use in immersion lithography, the substrate having a resist provided on a surface thereof and a topcoat provided on the surface of the resist, the topcoat having a contact angle to the liquid of less than 80°.

According to a further aspect of the invention, there is provided a use of a topcoat having a contact angle of less than 80° to a liquid used in immersion lithography to prevent bubbles sticking to a resist layer or a resist stack provided on a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
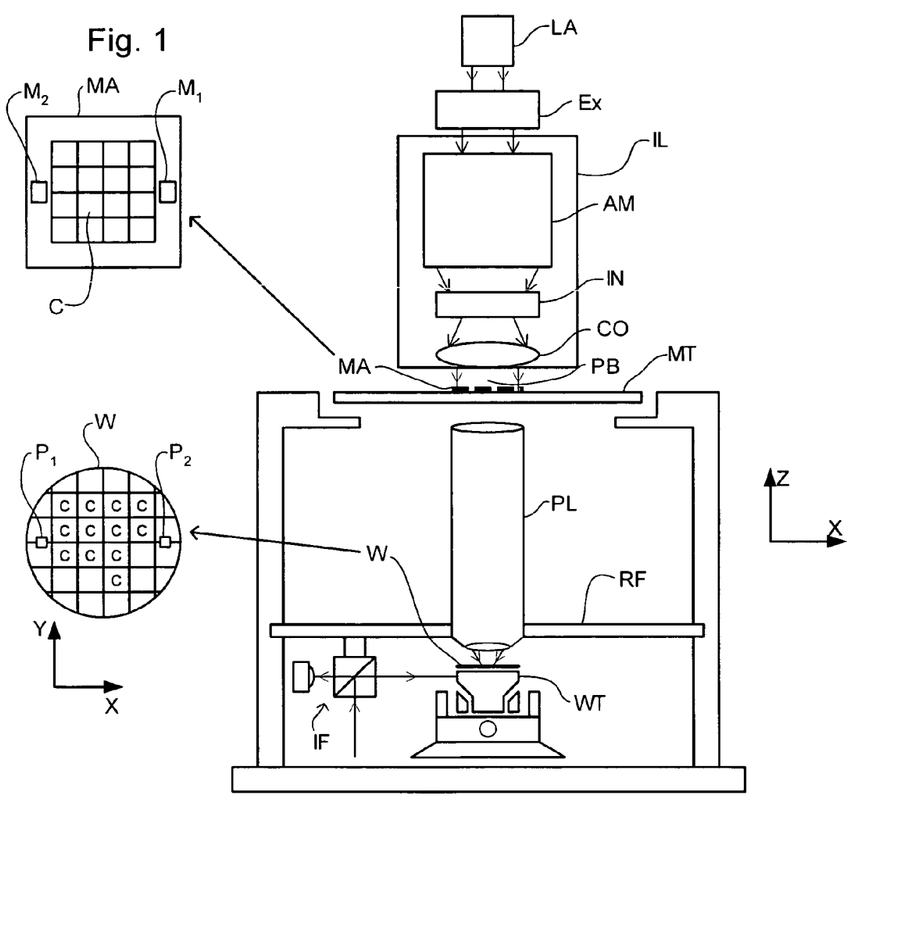
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting a patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. U.S. 10/705,783, hereby incorporated in its entirety by reference.

Figure 4:
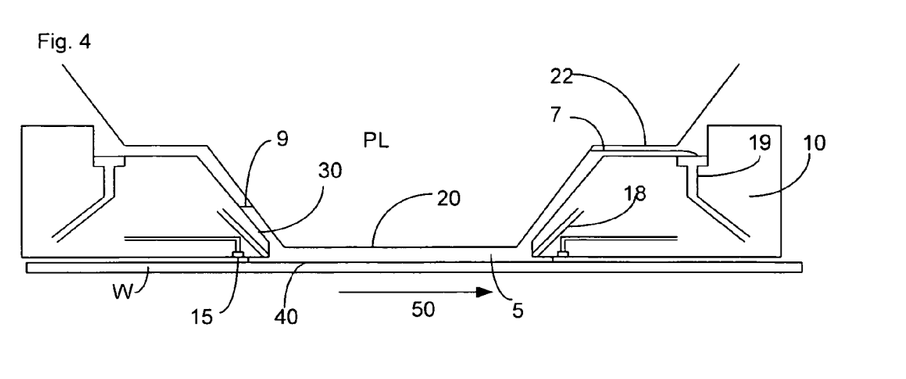
FIG. 4 illustrates, in cross section, an alternative liquid supply system according to an embodiment of the present invention.

FIG. 4 illustrates a liquid supply system which is similar to that of FIGS. 2 and 3 in that it provides liquid to only a localized area of the substrate W in a space between the substrate W and a final element of the projection system PL. The liquid touches both the substrate and final element and is continuously present between the two. The liquid supply system of FIG. 4 comprises a seal member 10 which extends around the outer circumference of a final element of the projection system PL. The seal member 10 has a seal device 15, which is in an embodiment a contactless seal device, which forms a seal between the bottom of the seal member 10 and the top surface of the substrate W. Thus, liquid 5 is confined between the substrate W, the seal member 10 and the projection system PL. The seal device 15 may be a gas seal which has a gas inlet and a gas outlet such as described in U.S. patent applicatio Ser. No. U.S. 10/705,783. A liquid inlet 18 provides the liquid 5 between the projection system PL and the substrate W. A similar liquid supply system in which there is no seal device 15 is possible in which the liquid is contained by capillary forces between the bottom of the seal member 10 which is fixed to the projection system and the substrate W. In an embodiment, the free working distance (i.e. the distance between the bottom of the final element of the projection system and the top surface of the substrate W) is of the order of 3 mm±0.2 or 0.1 mm but can be as low as 1 mm.

If a localized area liquid supply system as described above is used, it has been proposed to use a shutter member which is positionable on a side of the liquid supply system opposite the projection system such that the immersion liquid can be confined in the liquid supply system and between the projection system and the shutter member. This allows the liquid supply system to keep liquid under the projection system during, for example, a substrate swap. Such a system is disclosed in U.S. patent application Ser. No. U.S. 10/705,785, hereby incorporated in its entirety by reference.

Also, there is an advantage in using imaging sensors on the substrate table under the same conditions as the substrate itself will be imaged. The sensors are used to ensure that the substrate can be correctly positioned relative to the projection beam. These sensors include a transmission image sensor (TIS) which is a sensor that is used the measure the position at substrate level of a projected aerial image of a mark pattern at the reticle (mask) level. Typically the projected image at substrate level is a line pattern with a line width similar to the projection beam wavelength. The TIS measures these patterns by using a transmissive pattern with a photo detector underneath. The sensor data is used to measure the position of the mask with respect to the position of the substrate table in up to 6 degrees of freedom. The magnification and scaling of the projected mask are also measured by using 4 points on the mask. As the sensor must also be capable of measuring the pattern positions and influences of all illumination settings (sigma, projection system numerical aperture, all masks (binary, phase shift, etc.)), a small line width is used. Furthermore, the sensor is also used to measure/monitor the optical performance of the lithographic projection apparatus. Different measurements are implemented for measuring pupil shapes, and aberrations such as coma, spherical aberration, astigmatism and field curvature. For these measurements, different illumination settings are used in combination with different projected images. Another such sensor may be a projection system interferometer integrated in the lithographic apparatus (ILIAS). The ILIAS is an interferometric wavefront measurement system that performs (static) measurements on projection system aberrations (up to Zernicke 36), as needed, for system setup and calibration as well as for pupil measurements. The ILIAS may be used for monitoring and recalibration of the lithographic apparatus on a regular basis depending on the apparatus needs. A further sensor may be a dose (or spot) sensor. All of these sensors are used at substrate level and as such are positioned on the substrate table. In order to avoid the need to perform complex predictions about how an immersion liquid will affect the projection beam, it is desirable to illuminate the sensor(s) under the same conditions as the substrate is to be imaged i.e. with the immersion liquid in place between the projection system and the sensor.

To aid in keeping the immersion liquid within the liquid supply system, it can help to make any surfaces which slide under the liquid supply system such as the substrate W, substrate table WT, shutter member, one or more sensors, etc., such that immersion liquid has a contact angle of greater than 90°, 100°, 110° or 120° with the surface. The contact angle of a liquid to a surface is measured as the angle between the surface and the tangent plane of the liquid lying on that surface at a location where the interface of the liquid with the outside environment, for example air, is in contact with the surface.

The surface of the substrate will generally be a topcoat or a resist coating or the substrate material itself. In an embodiment, all of the top surface of the substrate table which comes in contact with immersion liquid has this property. Thus, the immersion liquid flows over those surfaces easily.

The surfaces of the liquid supply system and, in an embodiment, the final element 20 of the projection system PL or any other surfaces of the projection system in contact with immersion liquid are such that the immersion liquid makes a contact angle with those surfaces of less than 60°, less than 50°, less than 40°, less than 30°, less than 25°, less than 20°, less than 15°, or less than 10°. Thus, the immersion liquid 'sticks' to those surfaces and so loss of immersion liquid is reduced.

There are exceptions to the above general described desiderata. For instance, it may be advantageous to provide a surface 22 of the projection system which is not the final element and is above the liquid supply system, substantially parallel with the substrate W (e.g., an annulus in shape), to have a surface with which the immersion liquid makes a contact angle of 90° or more, 100° or more, 110° or more, or 120° or more. This can help in the extraction of liquid through extraction port 19. The one or more inlets and outlets of gas seal device 15 may also benefit from such a property. In contrast, the inner parts of the bottom surface of the seal member 10, radially inwardly of the seal device 15, may benefit from having a surface roughness increasing treatment applied to make the immersion liquid have a smaller contact angle with that area than with other areas.

When the substrate W is moved relative to the projection system PL (indicated by arrow 50), friction between the immersion liquid 5 and the substrate W may cause pressure to build up in the liquid and the level 7 of immersion liquid 5 to rise on one side and the level 9 to fall on the other side. This is the result of a pressure gradient introduced into the immersion liquid 5 and may result in gas being drawn into the exposing area of the liquid under the projection system.

It is possible to reduce the likelihood of gas being drawn into the exposing area as well as reducing the likelihood of formation of bubbles in the immersion liquid 5 in general, by providing surfaces of the substrate W, as well as the seal member 10 and the projection system PL, such that the immersion liquid 5 has a contact angle of less than 60°, less than 50°, less than 40°, less than 30°, less than 25°, less than 20°, less than 15° or less than 10° with the surfaces (liquid-philic). This ensures that the surfaces are wetted and if the immersion liquid 5 is based on water, the surfaces are hydrophilic. The surfaces concerned are the top surface 40 of the substrate W which is the surface to be imaged, the outer surface 20 of the final element of the projection system PL, in particular the bottom surface, and the inner surfaces of the seal member 10 which confine the immersion liquid 5 to the localized area.

The use of such surfaces (which may of course be coatings) means that the surface tension between the immersion liquid and the surfaces is larger than the surface tension between the immersion liquid and the surrounding environment (e.g. air). The effect is to optimize the removal of all gas bubbles from the surfaces.

One way of ensuring the desired contact angle is to lower the surface tension as much as possible in the immersion liquid. If the immersion liquid is substantially water (as is in the case of 193 nm wavelength projection beam), the surface tension may conveniently be lowered by adding a surfactant or soap to the immersion liquid, provided this has no adverse effects (e.g. loss of 193 nm transmission). Thus, the risk of enclosing gas in the immersion liquid is vastly reduced. Other factors, such as degree of roughness of the surface can also be used to improve the liquidphilic quality of a material.

Figure 5:
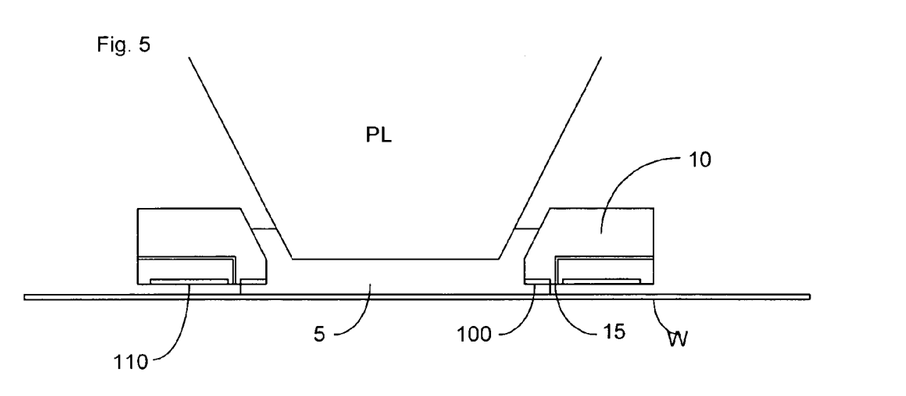
FIG. 5 illustrates, in cross section, a liquid supply system similar to that of FIG. 4 with further modifications according to an embodiment of the present invention.

An embodiment illustrated in FIG. 5 is the same as the embodiment described above with respect to FIG. 4 except as described below. In FIG. 5, the seal member 10 comprises layers which have different interactions with the immersion liquid 5. A first layer 100 comprises a material with which the immersion liquid 5 has a contact angle of less than 60°, less than 50°, less than 40°, less than 30°, less than 25°, less than 20°, less than 15° or less than 10° as described above. This ensures good wetting of that layer 100 by the immersion liquid 5 and reduces the likelihood of bubbles forming on that layer 100. The layer 100 is on an underside of the seal member 10 facing the substrate W and is placed closer to the optical axis of the apparatus than the seal device 15. On the other side of the seal device 15 is a second layer 110 with which the immersion liquid has a contact angle of greater than 90°, greater than 100°, greater than 110° or greater than 120° (liquid-phobic). This second layer 110 which is also on the bottom surface of the seal member 10 facing the substrate W has the effect of repelling immersion liquid 5 and thereby helps in ensuring the efficiency of the seal device 15.

Figure 6:
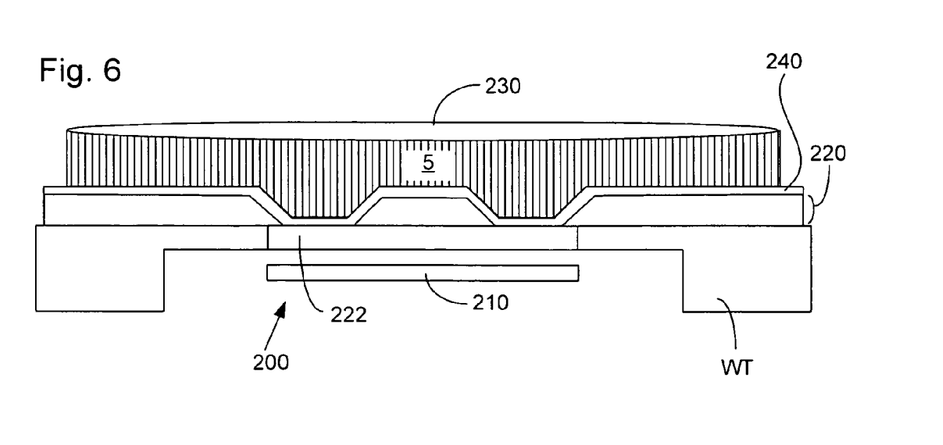
FIG. 6 illustrates a substrate table mounted sensor according to an embodiment of the present invention.
Figure 7:
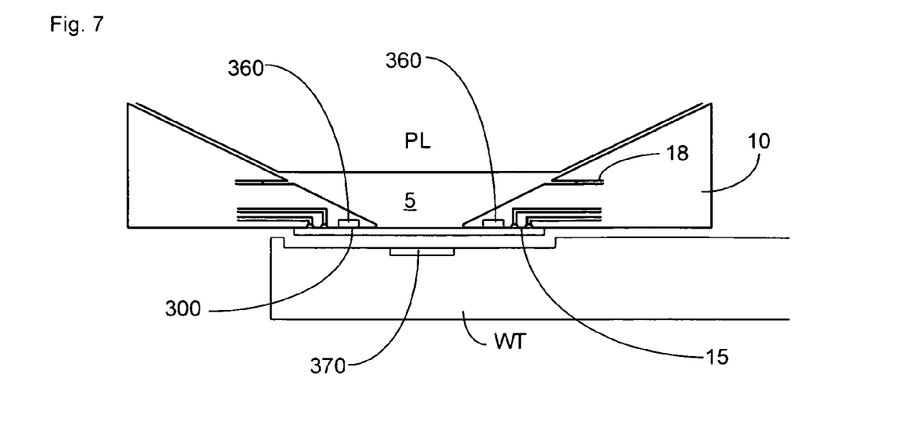
FIG. 7 illustrates a liquid supply system and a shutter member, in cross section, according to an embodiment of the present invention.

Embodiments illustrated in FIGS. 6 and 7 respectively are the same as the embodiment described above in relation to FIG. 4 and describe certain aspects of that embodiment in more detail.

The embodiment of FIG. 6 relates to through the projection system sensors 200 which are mounted on the substrate table WT and are imaged through the immersion liquid 5. The embodiment of FIG. 7 relates to a shutter member 300 which may be of either type (i.e. may be a separate member or may be part of the substrate table WT) described in United States patent application U.S. patent application No. 10/705,785, hereby incorporated in its entirety by reference.

Both embodiments make use of a surface which comes into contact with the immersion liquid 5 with which the immersion liquid has a contact angle of greater than 90°, greater than 100°, greater than 110°, or greater than 120°. The use of such a surface ensures that when the sensor 200 or shutter member 300 is moved away from the liquid supply system, residue of immersion liquid on the sensor 200 or shutter member 300 is unlikely.

In more detail, FIG. 6 illustrates a sensor 200, which may be any of the kinds previously described, and comprises a detector element 210, a transmissive sensor grating 222 and an absorption element 220. The absorption element 220 is used to enhance the sensor contrast and thus the overall sensor performance.

The transmissive sensor grating 222 is used for convolution of the projected aerial image of a corresponding pattern at reticle (mask) level (4 or 5 times larger than the pattern on the sensor). The convolution of the transmissive sensor grating 222 with the projected aerial image of the pattern at reticle level will provide an intensity profile depending on the position of the transmission sensor grating 222 at substrate level. With the intensity data at different substrate table positions, the position and shape of the aerial image can be calculated.

The sensor detector element 210 transforms the radiation that is transmitted to the open area of the grating into an electrical signal. The purpose of the absorption element 220 is to absorb part of the energy of the projection beam by providing areas of different absorption characteristics so that the sensor can achieve sufficient contrast. In an embodiment, the absorption element 220 is made of at least one metal layer such as aluminum and/or chromium (or alloys thereof) but may be made of layers of any metals.

In FIG. 6, the final element of the projection system PL is depicted as lens 230. In this embodiment, an immersion liquid 5, such as water, is present between the final element 230 of the projection system and the sensor 200. The top surface of the sensor 200 is provided with a coating 240 with which the immersion liquid 5 has a contact angle of more than 90°, more than 100°, more than 110°, or more than 120°.

The coating 240 serves one or more purposes. It enables easy removal of immersion liquid and/or prevents immersion liquid residue from remaining on the sensor. This means that measurements may also be performed using the sensor in gas (e.g. air), without the immersion liquid. The presence of immersion liquid residue could result in faulty measurements. A further effect of the coating layer 240 is to isolate the metal of the absorption element 220 from the immersion liquid 5 to avoid possible corrosion of the metal of the absorption element 220, for example by a galvanic reaction between metal layers forming the absorption element 220.

FIG. 7 illustrates an embodiment of a shutter member 300 (also termed a cover plate, closing plate, edge seal member, gap seal member or intermediary plate). The shutter member 300 may be a surface other than a substrate surface, perhaps an upper surface of the substrate table WT which is substantially co-planar with the upper surface of the substrate W and is closely adjacent to the edge of the substrate W. The area of the shutter member 300 is large enough so that if the substrate table WT is moved such that the projection system PL and seal member 10 are positioned over the shutter member 300, the shutter member blocks the entire aperture of the seal member 10 to prevent liquid escaping through the aperture. In this position, the substrate W can be removed from the substrate table WT using usual substrate handling equipment.

In the embodiment illustrated in FIG. 7, it is possible for the substrate table WT to be moved completely away from the projection system PL and the seal member 10 and for the substrate W to be removed from the substrate table WT and a new substrate to be placed on the substrate table WT.

In FIG. 7, the shutter member 300 is in the form of a plate with a primary cross sectional area larger than that of the localized area or aperture in the seal member 10. The shape of the shutter member 300 may be any shape so long as it covers the aperture. The shutter member 300 is not a substrate and is moveable relative to both the substrate table WT and the seal member 10 and may be attached to the seal member 10 by any means such as magnets 360 illustrated in FIG. 7.

After exposure of the substrate W the substrate table WT is moved so that the shutter member 300 is positioned under the aperture of the seal member 10. Once positioned under the projection system PL, the shutter member 300 is attached to the bottom of the seal member 10 to cover the aperture. The attachment method may be, for example, by a vacuum source. The substrate table WT may then be moved out of the way to a place where the substrate W may be exchanged. In FIG. 7, the shutter member 300 is attached to the substrate table WT by a magnet 370 when not attached to the seal member 10 but, if made of a non-magnetic material, may be attached by a vacuum source, for example.

The surface of the shutter member 300 which comes into contact with the immersion liquid 5 is such that the immersion liquid 5 has a contact angle of greater than 90°, greater than 100°, greater than 110° or greater than 120° with it. Thus, as with embodiment described in relation to FIG. 6, when the substrate table moves and the shutter member 300 is left behind, the seal device 15 on the seal member 10 can ensure that little, if any, immersion liquid 5 is left behind. Furthermore, significantly less force will be required to remove the shutter member 300 from the seal member 10 if the surface of the seal member is as described above, i.e., it rejects the immersion liquid. If the immersion liquid is water, the surface should be hydrophobic.

Figure 8:
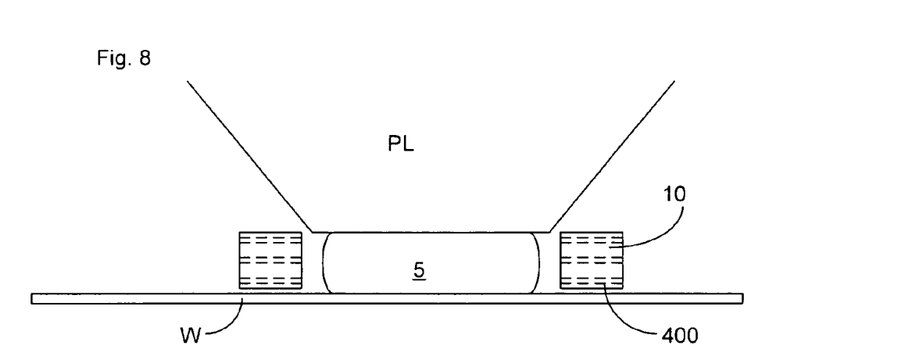
FIG. 8 illustrates a further liquid supply system according to an embodiment of the present invention.
Figure 9:
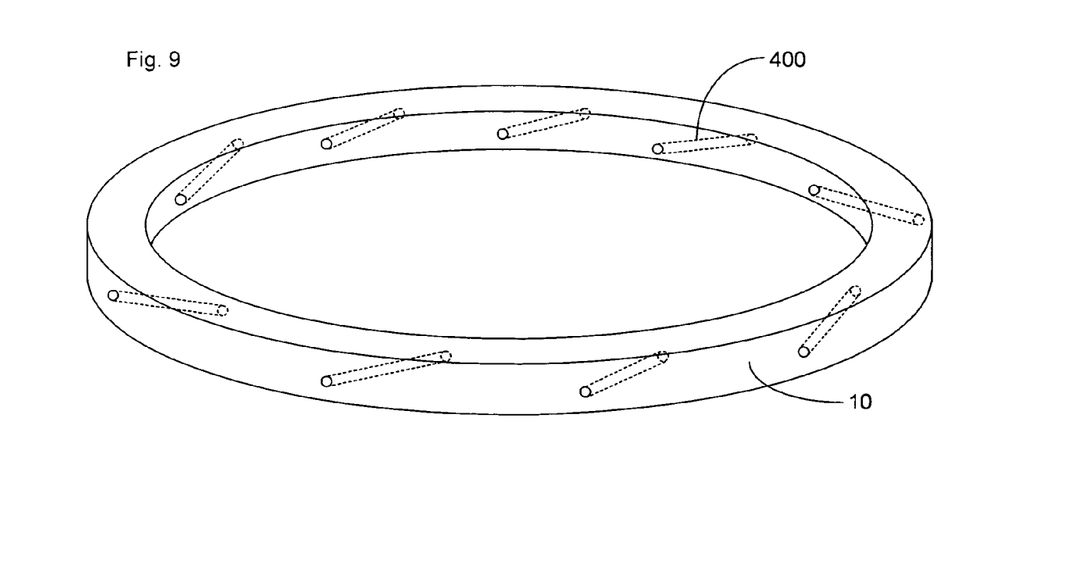
FIG. 9 illustrates schematically in projection an element of the liquid supply system of FIG. 8.

An embodiment illustrated in FIGS. 8 and 9 is the same as the embodiment described in reference to FIG. 4 except as described below.

In this embodiment, a different type of liquid confinement system is illustrated. The final element of the projection system PL and the top surface of the substrate W are made of a material with which the immersion liquid 5 has a contact angle of greater than 90°, greater than 100°, greater than 110°, or greater than 120°.

The immersion liquid 5 is held in place by pressurized gas on the surface of the liquid not in contact with the substrate W or the projection system PL. The pressurized gas is provided through inlets 400 in a seal member 10 which surrounds the immersion liquid 5. A plurality of inlets 400 are provided and they may be of any configuration which is effective to maintain the immersion liquid 5 in place.

It will be appreciated that FIG. 8 is schematic and that in fact the distance between the projection system PL and the substrate W is of the order of a few microns to a few mm so that the pressure of gas on the immersion liquid 5 required to keep the immersion liquid in place is low.

As can be seen in FIG. 8, the seal member 10 may comprise several sets of gas inlets 400 which are at different levels above the substrate W. However, this need not be the case and, as in FIG. 9, only one level of gas inlets 400 may be provided.

Different pressures of gas can be provided through individual inlets 400 to ensure that the immersion liquid 5 is in the correct position.

The seal member 10 may be attached to the projection system PL. The pressure of gas through inlets 400 may be controlled in a feedforward or feedback manner depending upon the measurement of the position of the immersion liquid 5. When the substrate W moves relative to the projection system PL forces will be generated within the immersion liquid 5 and based on measurement or prediction of this, the pressure of gas flowing through each of the gas inlets 400 can be adjusted accordingly, e.g., pressure on one side may be raised above the pressure on other sides.

As can be seen from FIG. 9, the gas inlets 400 are, in an embodiment, in a direction such that the gas is projected in a direction with a component towards the optical axis of the apparatus. The direction lies in a plane substantially parallel to the upper surface of the substrate W though is not directed exactly towards the optical axis. It is desirable to create a gas flow which swirls around the immersion liquid 5 and this is done by angling the direction of the gas inlets 400 away from the optical axis. It will be appreciated that other configurations of gas inlets may be used.

SURFACES AND IMMERSION LIQUIDS

When a projection beam wavelength of 193 nm is used, the immersion liquid is likely to be substantially water. On untreated glass, water has a contact angle of about 70°, on untreated aluminium or stainless steel, the contact angle is about 80°. The contact angle is the angle through the liquid. Embodiments described herein apply equally to other types of immersion liquid.

In one or more embodiments, surfaces which are liquidphobic (contact angle greater than 90°) or hydrophobic (if the immersion liquid is water) are used. These surfaces are generally made of polymers such as Teflon, polyethylene, polypropylene, polyacetal, fluoro-alkyl-silanes, wax or diamond like carbon.

One particularly effective surface which results in a high contact angle between most liquids and surfaces has been described in PCT patent application WO 96/04123, hereby incorporated in its entirety by reference. This surface, termed a 'lotus surface', is particularly suited to any of the embodiments described above which require a large contact angle between immersion liquid and a surface (hydrophobic surface) and comprises a surface structure consisting of elevations and depressions, where the distance between the elevations ranges from 5 to 200 microns and the height of the elevations ranges from 5 to 100 microns. At least the elevations are made of liquidphobic polymers or materials made durably liquidphobic and the elevations cannot be taken off by liquid (e.g., water) or by liquid with detergents.

In one or more embodiments, liquidphilic surfaces (contact angle less than 60°) or hydrophilic (if the immersion liquid is water) are used. These surfaces can be provided by a metal oxide (e.g. on the surface of a metal) or a glass (such as quartz or Zerodur). Surfaces should be highly cleaned of foreign matter if provided with such a surface treatment.

Thus, the type of surface needed can be provided by the material of the element itself, with a surface treatment if necessary, and/or by a coating on a surface of the element. For example, the substrate table WT is typically made of a structural glass or glass ceramic such as Zerodur. A coating of a polymer or a lotus surface treatment could be applied to make the surface liquidphobic. Another example might be a liquid supply system made of a polymer (e.g. Teflon) which is coated or has a surface treatment to make it liquidphilic or made of a metal (e.g. stainless steel) surface treated (e.g. highly cleaned and polished) to make it liquidphilic.

Another way to influence (reduce) the contact angle of the immersion liquid with the surface, is to add a surfactant to the immersion liquid. Adding a surfactant has the effect to reduce the surface tension, $\gamma$, of the liquid so that the bubble radius, R, of a stable bubble, which is given by:

$$R = \frac{4\gamma}{\Delta P}$$

where $\Delta P$ is the pressure difference across the interface, is reduced. Furthermore, the surface spreading coefficient S is also affected by the surface tension so that the contact angle of the liquid on a surface can be decreased by the addition of surfactants without changing the surface properties.

Surfactants might be organic or inorganic salts (whose ions disrupt the liquid molecules). The surfactants can be of any type (e.g. anionic, cationic, zwitterionic and non ionic) and added at a concentration which is effective to produce the desired result (usually below the critical micelle concentration).

Evaporation of the immersion liquid from the surface of the substrate may cause an unacceptable temperature drop of the substrate. It may therefore be advantageous to use one or more further additions to the immersion liquid to change the vapor pressure of the liquid to reduce evaporation.

TOPCOAT

Figure 10:
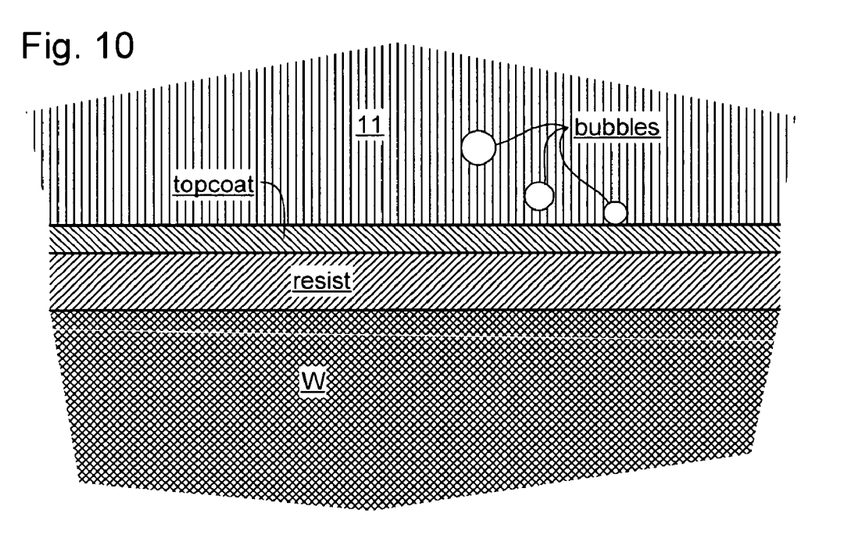
FIG. 10 illustrates in cross-section a topcoat applied to a substrate according to an embodiment of the invention.

In an embodiment, referring to FIG. 10, a topcoat is applied to the substrate, on top of the resist, to prevent gas (e.g., air) bubbles sticking to the surface of the resist or the resist stack. Bubbles on the resist during exposure may result in defects due to defocus and/or distortion of the printed image, reducing yield. According to an embodiment, the top coat is liquidphilic (i.e., hydrophilic if the immersion liquid is water based) and has a contact angle less than 80°, e.g. in the range of from 65 to 75°. Using surfaces with contact angles of 65° and 72°, the number of bubble defects per substrate may be reduced to less than 10, compared to about 500 with a hydrophobic topcoat or a resist with no topcoat, under the same conditions. The use of a liquidphilic topcoat is not believed to prevent formation of bubbles but instead prevents them from attaching to the substrate where they may cause defects. Bubbles that are prevented from attaching to the resist can be removed from the imersion liquid to prevent imaging defects being caused.

Topcoats are known in dry lithography and are used to protect the resist from gas borne contaminants and have been proposed for use in immersion lithography. However, in order to make the topcoat insoluble in the immersion liquid (e.g., water), a fluorinated polymer is added. A fluorinated polymer makes the topcoat liquidphobic, e.g. with a contact angle of about 118°. According to this embodiment, the amount of additive in the topcoat, especially fluorinated polymer, is selected to provide the desired degree of liquidphilicity.

The topcoat should also be applied using a solvent that is incompatible with the resist solvent, which is commonly propylene glycol monomethyl ether acetate (PGMEA) or ethyl lactate, sometimes with a co-solvent of methyl ethyl ketone (MEK), and is desirably easily soluble in the resist developer, which may be a weak (0.262 normal) alkaline solution of tetra-methyl ammonium hydroxide (TMAH). The topcoat should also be stable under intense irradiation with radiation of the exposure wavelength to be used, e.g. 248, 193 or 157 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

While specific embodiments of the invention have been described above, it will be appreciated that the invention may be practiced otherwise than as described. The description is not intended to limit the invention.

The invention claimed is:

1. A lithographic apparatus, comprising:
   an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, wherein the liquid has a contact angle of (a) less than 60° with the projection system, or the liquid supply system, or both, or (b) less than 60° with a surface of the substrate, or (c) both (a) and (b).

2. The apparatus according to claim 1, wherein the liquid includes an additive configured to reduce surface tension of the liquid.

3. The apparatus according to claim 2, wherein the additive is a surfactant, or a soap, or a salt, or any combination of the foregoing.

4. The apparatus according to claim 1, wherein surface tension between the liquid and (i) the substrate, or (ii) the projection system, or (iii) the liquid supply system, or (iv) any combination of (i)-(iii), is greater than between the liquid and air.

5. The apparatus according to claim 1, wherein the liquid has a contact angle of less than 60° with a surface of the projection system and the liquid supply system and a contact angle of greater than 90° with a (i) surface of the substrate, or (ii) the substrate table, or (iii) a substrate table mounted sensor, or (iv) any combination of (i)-(iii).

6. The apparatus according to claim 1, wherein the surface with which the liquid has a contact angle of less than 60° comprises a glass, a glass ceramic, a metal oxide or a metal.

7. The apparatus according to claim 6, wherein the surface has been surface treated.

8. The apparatus according to claim 6, wherein the surface has a coating or a polymer.

9. The apparatus according to claim 1, wherein the liquid has a contact angle of less than 60° with the surface of the substrate.

10. The apparatus according to claim 1, wherein an inlet and outlet of the liquid supply system, or a part of the projection system not being a final element of the projection system, or both, have a surface with which the liquid has a contact angle of greater than 90°.

11. The apparatus according to claim 10, wherein the surface with which the liquid has a contact angle of greater than 90° is a surface with which the liquid has a contact angle of greater than 100°, 110° or 120°.

12. The apparatus according to claim 1, wherein the surface with which the liquid has a contact angle of less than 60°, is a surface with which the liquid has a contact angle of less than 50°, 40°, 30°, 25° or 20°.

13. A lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and (a) the substrate, or (b) a sensor, or (c) a shutter member, or (d) any combination of (a)-(c), with a liquid, wherein the liquid has a contact angle of greater than 90° with a surface of (e) the substrate, or (f) the sensor, or (g) the shutter member, or (h) any combination of (e)-(g), which surface is (i) alignable with an optical axis of the apparatus, or (j) substantially all of a top surface of the substrate table, or (k) both (i)-(j).

14. A lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, wherein the liquid has a contact angle of greater than 90° with surfaces of both the substrate and the projection system and the liquid supply system comprises a plurality of gas inlets configured to confine the liquid to a localized area of the substrate..

15. The apparatus according to claim 14, wherein the plurality of gas inlets are positioned around the optical axis of the apparatus and are configured to direct gas in a direction with at least a component towards the optical axis.

16. The apparatus according to claim 15, wherein the direction is in a plane substantially parallel to a top surface of the substrate.

17. The apparatus according to claim 15, wherein the plurality of gas inlets are not oriented directly towards the optical axis of the apparatus so as to create a flow of gas in a circular pattern around the optical axis.

18. The apparatus according to claim 13, wherein the liquid has a contact angle of greater than 90° with the surface of (i) the substrate table, or (ii) the sensor, or (iii) the shutter member, or (iv) any combination of (i)-(iv), and the liquid has a contact angle of less than 60° with a surface of the projection system, or the liquid supply system, or both.

19. The apparatus according to claim 13, wherein the surface with which the liquid has a contact angle of greater than 90° comprises elevations and depressions, wherein the distance between elevations ranges from 5 to 200 μm and the height of the elevations from 5 to 100 μm and wherein at least the elevations are made of a liquidphobic polymer or a material made durably liquidphobic.

20. The apparatus according to claim 13, wherein the surface with which the liquid has a contact angle of greater than 90° is a polymer.

21. The apparatus according to claim 13, wherein an inlet and outlet of the liquid supply system, a part of the projection system not being a final element of the projection system, or both, has a surface with which the liquid has a contact angle of greater than 90°.

22. The apparatus according to claim 13, wherein the surface with which the liquid has a contact angle of greater than 90° is a surface with which the liquid has a contact angle of greater than 100°, 110° or 120°.

23. The apparatus according to claim 13, wherein the surface with which the liquid has a contact angle of less than 60°, is a surface with which the liquid has a contact angle of less than 50°, 40°, 30°, 25° or 20°.

24. A device manufacturing method, comprising:

providing a liquid to a space between a projection system of a lithographic projection apparatus and a substrate, the liquid having a contact angle of (a) less than 60° with the projection system, or a liquid supply system used to provide the liquid, or both, or (b) less than 60° with a surface of the substrate, or (c) both (a) and (b); and projecting a patterned beam of radiation through the liquid using the projection system onto a target portion of the substrate.

25. The method according to claim 24, wherein the liquid has a contact angle of less than 60° with the surface of the substrate.

26. A device manufacturing method, comprising:
providing a liquid to a space between a projection system of a lithographic projection apparatus and (a) a substrate, or (b) a sensor, or (c) a shutter member, or (d) any combination of (a)-(c), with a liquid, the liquid having a contact angle of greater than 90° with a surface of (e) the substrate tale, or (f) the sensor, or (g) the shutter member, or (h) any combination of (e)-(h), which surface is (i) alignable with an optical axis of the lithographic projection apparatus, or (j) substantially all of a top surface of a substrate table holding the substrate, or (k) both (i) and (j); and projecting a patterned beam of radiation using the projection system through the liquid onto a target portion of the substrate.

27. The apparatus according to claim 1, wherein the liquid has a contact angle of less than 60° with the liquid supply system.

28. The apparatus according to claim 13, wherein the liquid supply system is configured to at least partly fill a space between the projection system and the substrate table and the liquid has a contact angle of greater than 90° with a surface of the substrate table.

29. A lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, wherein the liquid has a contact angle greater than 70° but less than or equal to 80° with a surface of the substrate.

30. The apparatus according to claim 29, wherein the contact angle is greater than 70° but less than or equal to 72° with a surface of the substrate.

31. The apparatus according to claim 29, wherein the surface has a coating or a polymer.

32. The apparatus according to claim 31, wherein the coating or polymer is over a layer of resist on the substrate.

33. The apparatus according to claim 31, wherein the coating or polymer is insoluble in the liquid.

34. The apparatus according to claim 31, wherein the coating or polymer is insoluble in a solvent for a resist of the substrate but soluble in a developer for the resist.

35. The apparatus according to claim 31, wherein the surface has a coating comprising a fluorinated polymer.

* * * * *

UNITED STATES PATENT AND TRADEMARK OFFICE
CERTIFICATE OF CORRECTION

PATENT NO. : 7,528,929 B2
APPLICATION NO. : 10/986178
DATED : May 5, 2009
INVENTOR(S) : Bob Streefkerk et al.

It is certified that error appears in the above-identified patent and that said Letters Patent is hereby corrected as shown below:

Claim 13, Column 16, Line 2
  after "substrate" insert --table--

Claim 14, Column 16, Line 23
  change "substrate.." to --substrate.--

Claim 26, Column 17, Line 12
  after "substrate" insert --table--

Claim 26, Column 17, Line 16
  change "tale" to --table--

Claim 26, Column 17, Line 17
  change "(e)-(h)," to --(e)-(g),--

Claim 30, Column 18, Line 17
  change "70 °" to --70°--

Claim 35, Column 18, Line 29
  change "31" to --29--.

Signed and Sealed this
Tenth Day of April, 2012

David J. Kappos
*Director of the United States Patent and Trademark Office*